(12) United States Patent
Zhang et al.

(10) Patent No.: US 8,776,833 B2
(45) Date of Patent: Jul. 15, 2014

(54) AIR DUCT FOR ELECTRONIC DEVICE

(75) Inventors: Guang-Yi Zhang, Shenzhen (CN);
Wen-Tang Peng, Tu-Cheng (TW);
Yi-Wei Fan, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 817 days.

(21) Appl. No.: 12/978,626

(22) Filed: Dec. 26, 2010

(65) Prior Publication Data

US 2012/0145269 A1 Jun. 14, 2012

(30) Foreign Application Priority Data

Dec. 11, 2010 (CN) .......................... 2010 1 0583203

(51) Int. Cl.
*F15D 1/04* (2006.01)
*H05K 5/00* (2006.01)
*F24F 13/10* (2006.01)
*H01L 23/467* (2006.01)

(52) U.S. Cl.
CPC ............. *H01L 23/467* (2013.01); *Y10S 138/04* (2013.01)
USPC ............ 138/46; 138/37; 138/38; 138/DIG. 4; 138/178; 454/184; 454/266; 361/697; 165/80.3

(58) Field of Classification Search
CPC ........ H01L 23/467; F24F 13/10; F24F 13/16; F24F 13/1486
USPC ................ 138/46, 37, 38; 454/266, 267, 184; 361/690, 695, 697; 165/80.3
See application file for complete search history.

(56) References Cited

U.S. PATENT DOCUMENTS

| | | | | |
|---|---|---|---|---|
| 3,958,605 | A * | 5/1976 | Nishizu et al. | 138/46 |
| 4,633,900 | A * | 1/1987 | Suzuki | 137/504 |
| 5,398,728 | A * | 3/1995 | Baumeister et al. | 138/37 |
| 8,305,752 | B2 * | 11/2012 | Ke et al. | 361/679.49 |
| 2012/0155021 | A1 * | 6/2012 | Wei | 361/690 |

* cited by examiner

*Primary Examiner* — Patrick F Brinson
(74) *Attorney, Agent, or Firm* — Novak Druce Connolly Bove + Quigg LLP

(57) ABSTRACT

An air duct includes a main body, and an adjusting assembly. The main body includes a top plate and two lateral plates extending from opposite sides of the top plate. The adjusting assembly includes two first limiting plates, a second limiting plate, and a third plate. The second and third limiting plates are slidably attached to each other, and are respectively pivotably attached to the first limiting plates. Each first limiting plate is adjustably attached to the lateral plates.

7 Claims, 4 Drawing Sheets

AIR DUCT FOR ELECTRONIC DEVICE

BACKGROUND

1. Technical Field

The present disclosure relates to an air duct.

2. Description of Related Art

With the continuing development of electronic technology, central processing units (CPUs) generate more heat during operation than previously. The heat needs to be dissipated as quickly as possible. A common method for dissipating the heat is to use a heat sink mounted above a CPU and a fan used to generate airflow to dissipate heat from the CPU. Furthermore, an air duct is often used to assist in heat dissipation. Usually, the air duct covers the heat sink, and the fan is installed at or near an inlet of the air duct. However, heat sinks of different sizes need air ducts with different sizes, there is a need to have a flexible air duct that can fit for different heat sinks.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
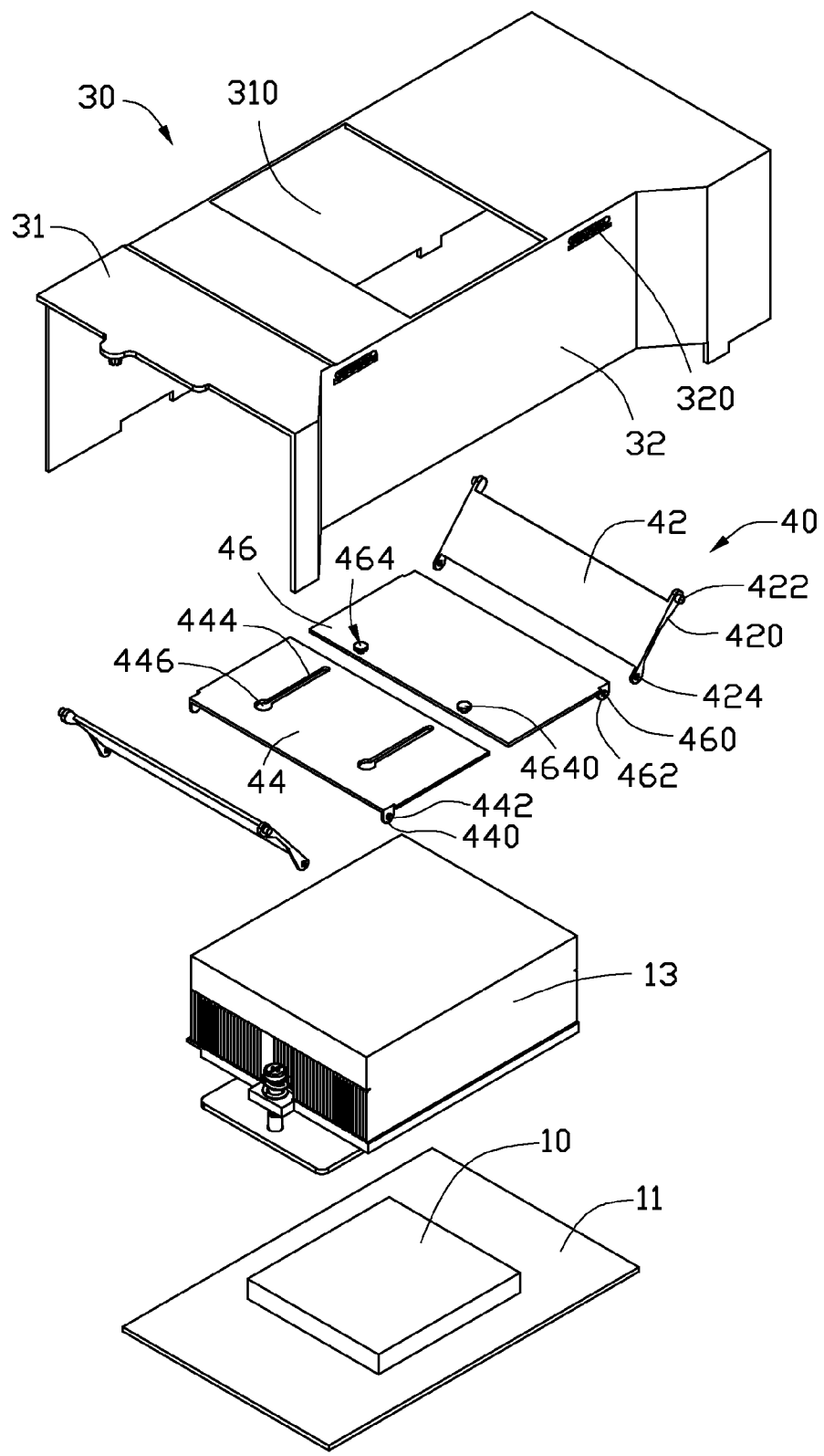
FIG. 1 is an exploded, isometric view of an exemplary embodiment of an air duct, together with a heat generating member and a heat sink.
Figure 2:
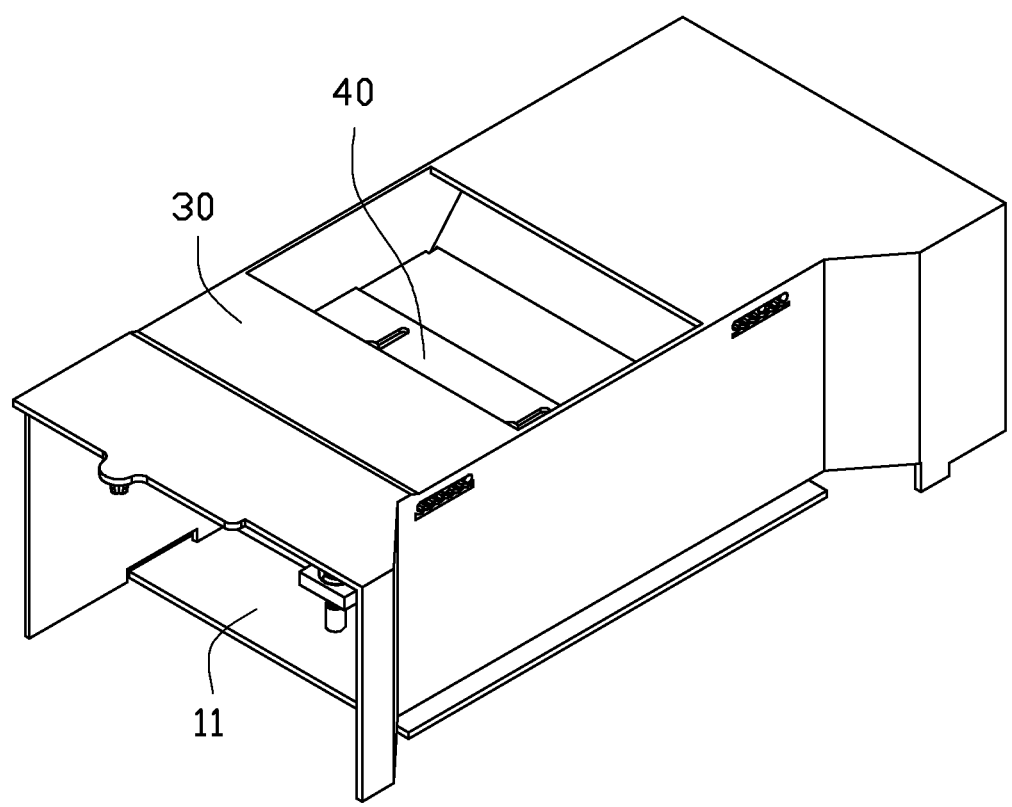
FIG. 2 is an assembled, isometric view of FIG. 1.

Referring to FIGS. 1 and 2, an air duct is provided to dissipate heat from a heat generating member 10 mounted on a circuit board 11 of an electronic device (not shown). A heat sink 13 covers on a top of the heat generating member 10. The air duct includes a main body 30 and an adjusting assembly 40.

The main body 30 includes a top plate 31, and two lateral plates 32 extending down from opposite sides of the top plate 31. The top plate 31 defines an opening 310. Each lateral plate 32 defines two slide slots 320. An indentation and a plurality of latching portions 322 (labeled in FIG. 3) are defined in the bottom side of each slide slot 320.

The adjusting assembly 40 includes two first limiting plates 42, a second limiting plate 44, and a third limiting plate 46.

Two elongated bars 420 extend down from opposite ends of each first limiting plate 42. A post 422 extends outward from a first end of each bar 420. A second end of each bar 420 opposite to the first end defines a pivot hole 424.

Two first tabs 440 extend down from opposite ends of a first side of the second limiting plate 44. A first pivot pin 442 extends outward from each first tab 440. The second limiting plate 44 defines two elongated through slots 444 parallel to the ends of the second limiting plate 44, and two installation holes 446 each communicating with one end of a corresponding through slot 444. The installation holes 446 are adjacent to the first side of the second limiting plate 44.

Two second tabs 460 extend down from opposite ends of a first side of the third limiting plate 46. A second pivot pin 462 extends outward from each second tab 460. The third limiting plate 46 defines two mounting holes (not shown), with two latching members 464 engaged in the mounting holes. A head 4640 protrudes form one end of each latching member 464 away from the third limiting plate 46. A size of each flange 4640 is larger than a width of a corresponding through slot 444 but smaller than the corresponding installation hole 446.

Figure 3:
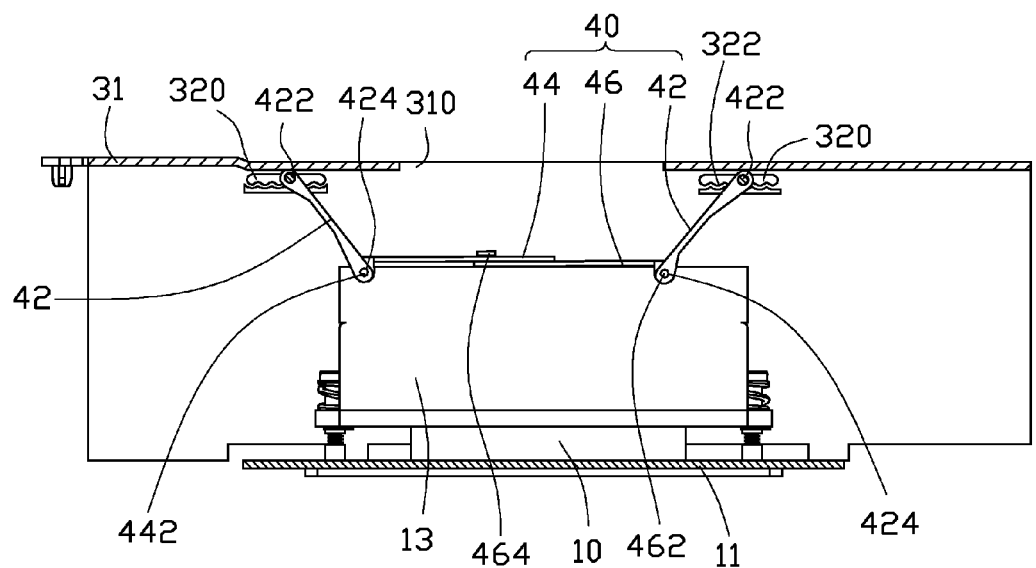
FIGS. 3 and 4 are cross-sectional views of FIG. 2, showing different states of use.
Figure 4:
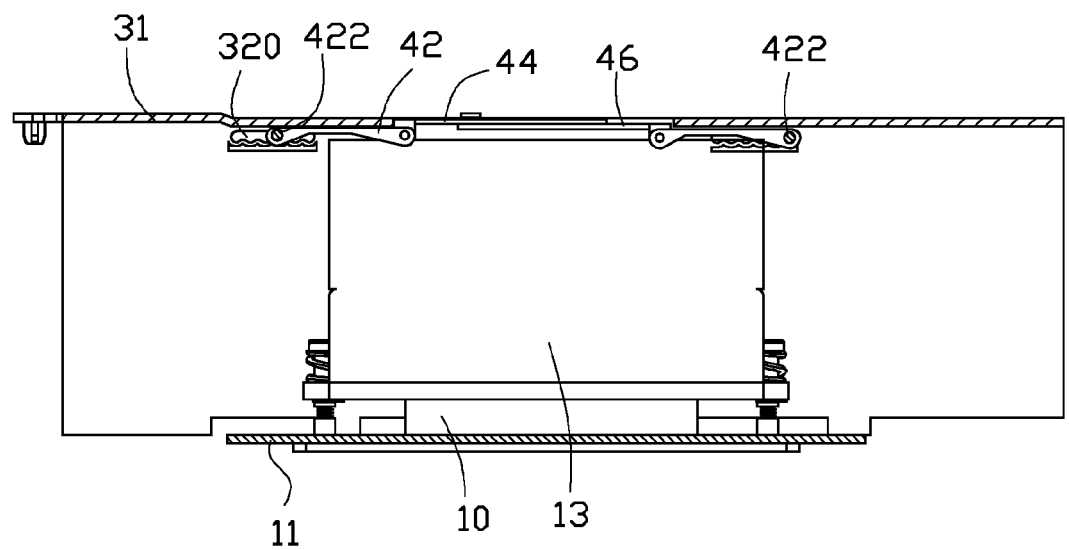

Referring to FIGS. 2 to 4, in assembly, the heads 4640 of the latching members 464 extend through the installation holes 446 of the second limiting plate 44, then the latching members 464 enter the through slots 444. Thus, the third limiting plate 46 is slidably mounted to the second limiting plate 44. The second limiting plate 44 and the third limiting plate 46 are positioned on a top of the heat sink 13. According to a size of the top of the heat sink 13, the third limiting plate 46 slides relative to the second limiting plate 44 through the latching members 464 sliding in the through slots 444, to fully cover the top of the heat sink 13 with the second and third limiting plates 44 and 46. The latching members 464 are moved in the mounting holes of the third limiting plate 46, to make the heads 4640 move towards the third limiting plate 46, thereby the heads 4640 resist against the second limiting plate 44, to tightly fasten the third limiting plate 46 to the second limiting plate 44. The first limiting plates 42 are pivotably mounted to the second and third limiting plates 44 and 46 by the first and second pivot pins 442 and 462 of the second and third limiting plates 44 and 46 pivotably engaged in the pivot holes 424 of the corresponding first limiting plates 42.

The main body 30 is covered on the heat sink 13, with the ends of the second and third limiting plates 44 and 46 resisting against inner surfaces of the lateral plates 32. According to a height of the heat sink 13, the first limiting plates 42 are rotated relative to the second and third limiting plates 44 and 46, the posts 422 of the first limiting plates 42 slide in the slide slots 320 of the lateral plates 32. When the first limiting plates 42 resist against the top plate 31, the posts 422 are latched into the corresponding latching portions 322.

In this embodiment, the opening 310 can reduce the weight of the main body 30 and is convenient to observe the position of the first limiting plates 42.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

The invention claimed is:

1. An air duct comprising:
   a main body comprising a top plate and two lateral plates extending down from opposite sides of the top plate; and
   an adjusting assembly comprising two first limiting plates, a second limiting plate, and a third limiting plate;
   wherein the second and third limiting plates are slidably attached to each other, and respectively pivotably attached to the first limiting plates, each first limiting plate is adjustably attached to the lateral plates.

2. The air duct of claim 1, wherein each lateral plate defines two slide slots, two elongated bars extend from opposite ends of each first limiting plate, a post extends outward from a first end of each bar, the posts of each first limiting plate are adjustably engage in corresponding positions of the corresponding slide slots of the lateral plates.

3. The air duct of claim 2, wherein a bottom of each slide slot is indentation-shaped and defines a plurality of latching portions to fasten the corresponding post.

4. The air duct of claim 2, wherein two first tabs extend down from opposite ends of a first side of the second limiting plate, a first pivot pin extends outward from each first tab, two second tabs extend down from opposite ends of a first side of the third limiting plate, a second pivot pin extends outward from each second tab, a second end of each bar defines a pivot hole, the first and second pivot pins are pivotably engaged in the corresponding pivot holes.

5. The air duct of claim 1, wherein the second limiting plate defines two elongated through slots parallel to opposite ends of the second limiting plate, two latching members are arranged on the third plate to slidably engage in the through slots, to make the second and third limiting plates be slidably attached to each other.

6. The air duct of claim 5, wherein the second limiting plate defines two installation holes communicating with the elongated through slots, and a head extends from each latching member to extend through the corresponding installation hole to make the latching member enter the corresponding through slot.

7. The air duct of claim 5, wherein a size of the head of each latching member is larger than a width of the through slot but smaller than the installation hole.

\* \* \* \* \*